(12) United States Patent
Tsironis

(10) Patent No.: US 9,257,963 B1
(45) Date of Patent: Feb. 9, 2016

(54) IMPEDANCE TUNERS WITH ROTATING PROBES

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 23 days.

(21) Appl. No.: 14/311,413

(22) Filed: Jun. 23, 2014

Related U.S. Application Data

(60) Provisional application No. 61/839,910, filed on Jun. 27, 2013.

(51) Int. Cl.
*H03H 7/38* (2006.01)
*H03H 17/00* (2006.01)
*H03H 7/40* (2006.01)

(52) U.S. Cl.
CPC ............ *H03H 17/0045* (2013.01); *H03H 7/40* (2013.01)

(58) Field of Classification Search
CPC ............... H03H 7/38; H03H 7/40; H01P 1/18
USPC ........................................... 333/33, 17.3, 263
See application file for complete search history.

(56) References Cited

U.S. PATENT DOCUMENTS

| 3,340,485 A * | 9/1967 | Caron ..................... H01P 7/04 333/224 |
| 2013/0002367 A1* | 1/2013 | Tsironis ................. H03H 7/20 333/17.3 |

* cited by examiner

*Primary Examiner* — Stephen E Jones

(57) ABSTRACT

A new slide-screw impedance tuner structure uses rotating metallic probes. This ensures high resolution in the area where the gap between center conductor and probe is small (high GAMMA), a smooth increase of proximity between probe and center conductor (basic anti-corona form) and the possibility to compensate for the negative phase slope at higher GAMMA, native to traditional slide screw tuners. Additionally the new structure simplifies the tuner mechanics by eliminating the need for a precise vertical axis.

15 Claims, 16 Drawing Sheets

FIGURE 6: a) prior art, b) new

FIGURE 15: Prior art

IMPEDANCE TUNERS WITH ROTATING PROBES

PRIORITY CLAIM

The present application claims priority on provisional application 61/839,910, filed on Jun. 27, 2013 named: Impedance tuners with rotating probes.

CROSS-REFERENCE TO RELATED ARTICLES

1. Load Pull Measurements http://en.wikipedia.org/wiki/Load_pull
2. Product Note 41; Computer Controlled Microwave Tuner-CCMT; Focus Microwaves January 1998.
3. Standing wave ratio, VSWR https://e.wikipedia.org/wiki/Standing_wave_ratio
4. Tapered impedance transformers http://www.microwaves101.com/encyclopedia/transformers tapered.cfm
5. Application Note 15; High Resolution Tuners Eliminate Load Pull Performance Errors; Focus Microwaves, January 1995.

BACKGROUND OF THE INVENTION

This invention relates to RF load and source pull testing of medium and high power RF transistors and amplifiers using remotely controlled electro-mechanical impedance tuners. Modern design of high power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models.

A popular method for testing and characterizing such microwave components (transistors) in the non-linear region of operation is "load pull". Load pull is a measurement technique employing microwave tuners and other microwave test equipment. The microwave tuners are used in order to manipulate the microwave impedance conditions under which the Device Under Test (DUT, or transistor) is tested, see ref. 1; this document refers hence to "impedance tuners", in order to make a clear distinction to "tuned receivers (radios)", popularly called elsewhere also "tuners" because of the included tuning circuits, see ref. 2.

Impedance tuners comprise, in general, a transmission line and a number of serial or parallel conductive tuning elements (probes, 22, 30, 41, 51, 52, 61) fixed or adjustable (FIGS. 2 to 5 and 6a), which, when approaching the center conductor (32) of the slabline (31) and moved along the axis of the slabline (45) create a variable reactance, allowing thus the synthesis of various impedances (or reflection factors) covering parts or the totality of the Smith chart (the normalized reflection factor area). The relation between reflection factor and impedance is given by GAMMA, (Z−Zo)/(Z+Zo), where Z is the complex impedance Z=R+jX and Zo is the characteristic impedance. A typical value used for Zo is Zo=50 Ohm, see ref. 3.

Up to now such conductive or metallic probes (slugs) have been made in a cubical form (41) with a concave bottom (35) which allows capturing (when lowered towards the center conductor) the electric field which is concentrated in the area (36) between the center conductor (32) and the ground planes of the slabline (31), FIG. 3. This field capturing allows creating high and controllable reflection factors. The disadvantage of this technique is the requirement of very high precision and resolution vertical probe movement mechanisms (33, 21, 53). Because most of the field capturing effect occurs when the probe is very close to the center conductor, also a high resolution control mechanism is needed. This, on the other hand, slows down the tuning procedure, since, when the probe is away from the center conductor, the tuning effect is much less active, but the vertical moving speed is the same, see FIG. 15. In praxis, it takes typically 5 seconds to tune from GAMMA=0.05 to GAMMA=0.1 (VSWR from 1.1:1 to 1.22:1) and only 1 second to tune from GAMMA=0.9 to GAMMA=0.95 (VSWR from 19:1 to 39:1), see FIG. 15. In FIG. 15 tuning speed is proportional to the change in VSWR divided by the change in vertical position (Y): TUNING SPEED=$\Delta$VSWR/$\Delta$Y {eq. 1}, whereas the vertical position is directly proportional to the motor stepping speed. It can be seen (FIG. 15) that the slope of the curve (which is equivalent to the tuning speed) of the tuner increases as the probe approaches mechanical contact. When the probe is close to the center conductor, high tuning speed is unfavorable, because it corresponds to low tuning resolution ($\Delta$VSWR per motor step). In this tuning range a rather low tuning speed (high tuning resolution) is required; whereas the opposite is true when the probe is far away from the center conductor.

The proposed new probe structure (FIGS. 6b, 7 and 8 to 12) improves on both: it simplifies the precise vertical axis and improves the tuning speed (resolution).

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 3:
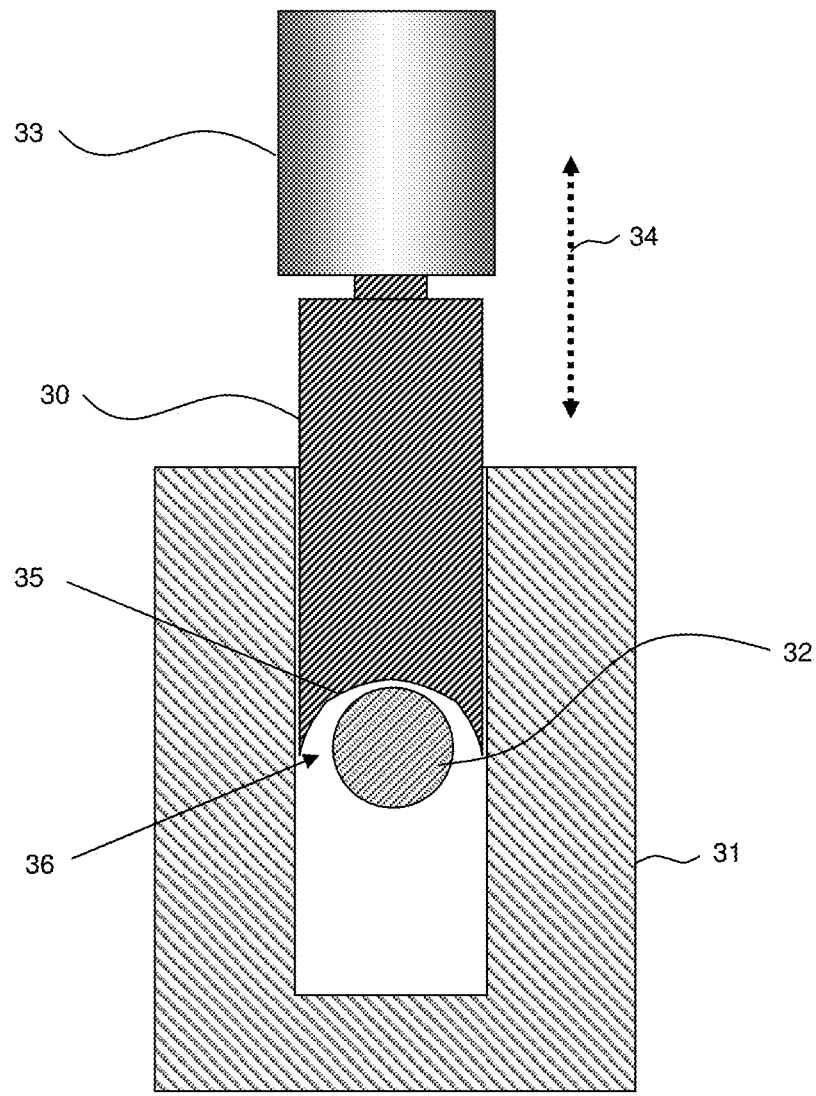
FIG. 3 depicts prior art, cross section of RF probe inside a slotted airline (slabline) approaching the center conductor.
Figure 4:
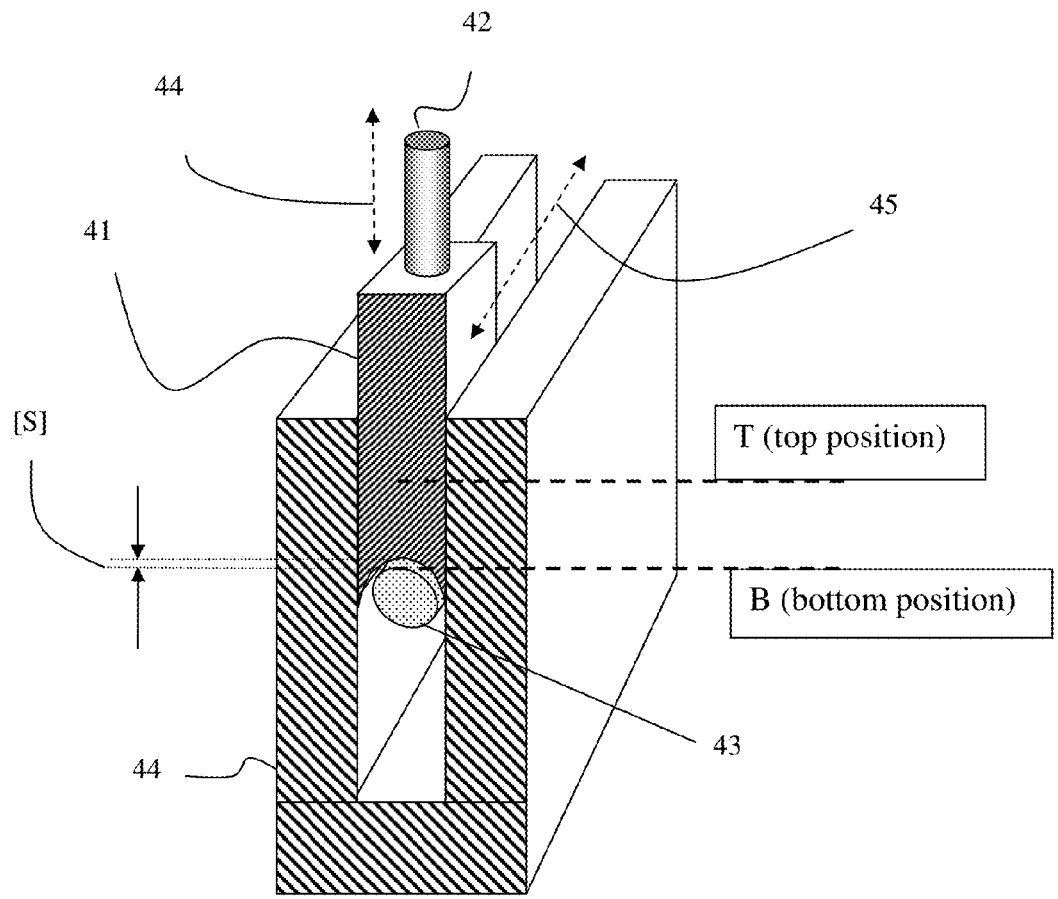
FIG. 4 depicts prior art, a perspective view of relevant dimensions and parameters of the operation of a vertically adjustable RF probe (slug).
Figure 6:
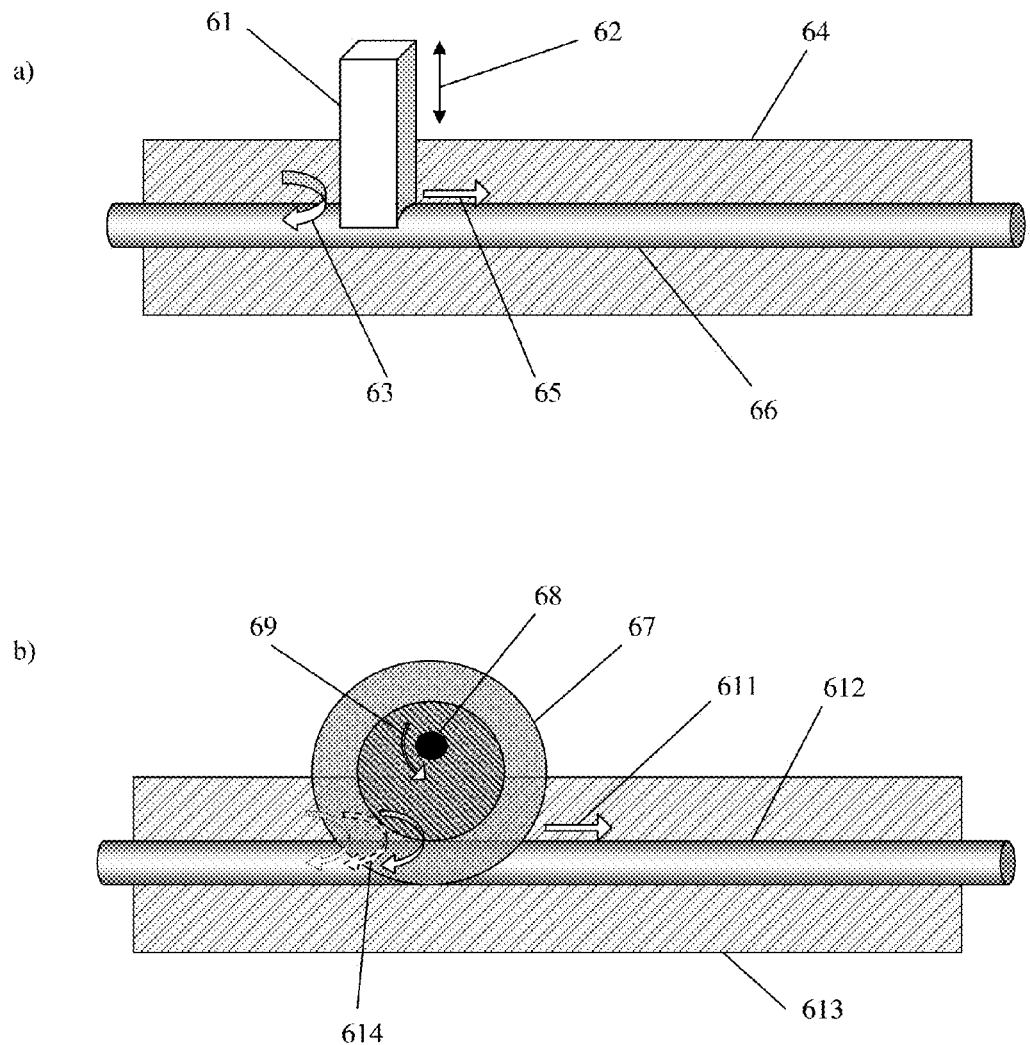
FIG. 6 depicts: a) prior art, a perspective view of a vertical probe (slug) approaching the center conductor; b) new, an eccentrically rotating probe operating in a conventional slabline.
Figure 15:
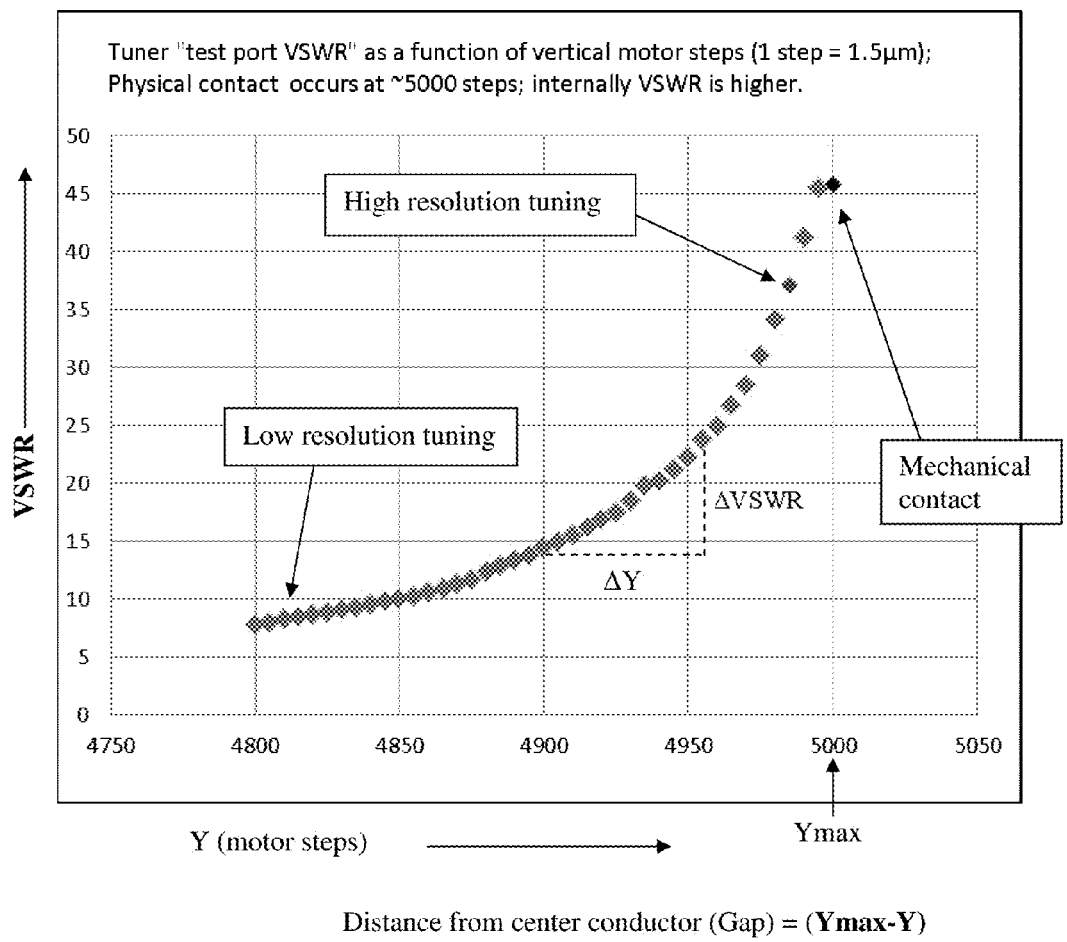
FIG. 15 depicts prior art, tuning resolution of a traditional RF probe (as in FIGS. 3, 4 and 6a).

This invention describes a radio frequency, computer controlled electro-mechanical impedance tuner apparatus and a method, which uses metallic (conductive) disc-formed RF probes, instead of block-formed probes used hitherto in such devices. The new probes are shown in FIGS. 6b), 7 and 8 to 13. Further differences to prior art tuners are the missing vertical axis and associated precision gear. Beyond that the tuners operate in a similar way and provide equivalent RF performance as prior art slide screw tuners. The fundamental difference is shown in FIG. 6: FIG. 6a) shows a prior art RF probe (slug) (61); the slug can be inserted into the slot of the slabline (64) and be positioned (62) in various distances from the center conductor (66); the capacitive coupling between slug (61) and center conductor (66), shown also in FIGS. 3 and 4, creates a controllable complex reflection factor GAMMA=|GAMMA|*exp(jΘ) (equivalent to a Voltage Standing Wave Ratio: VSWR=(1+GAMMA)/(1−GAMMA). As is shown in FIGS. 3 and 15, the distance between slug and center conductor must be very small (of the order of a few dozens of micrometers) in order to create sufficient VSWR. This is the case also in the new probes (discs) of FIGS. 6b) and 7 to 13.

Figure 8:
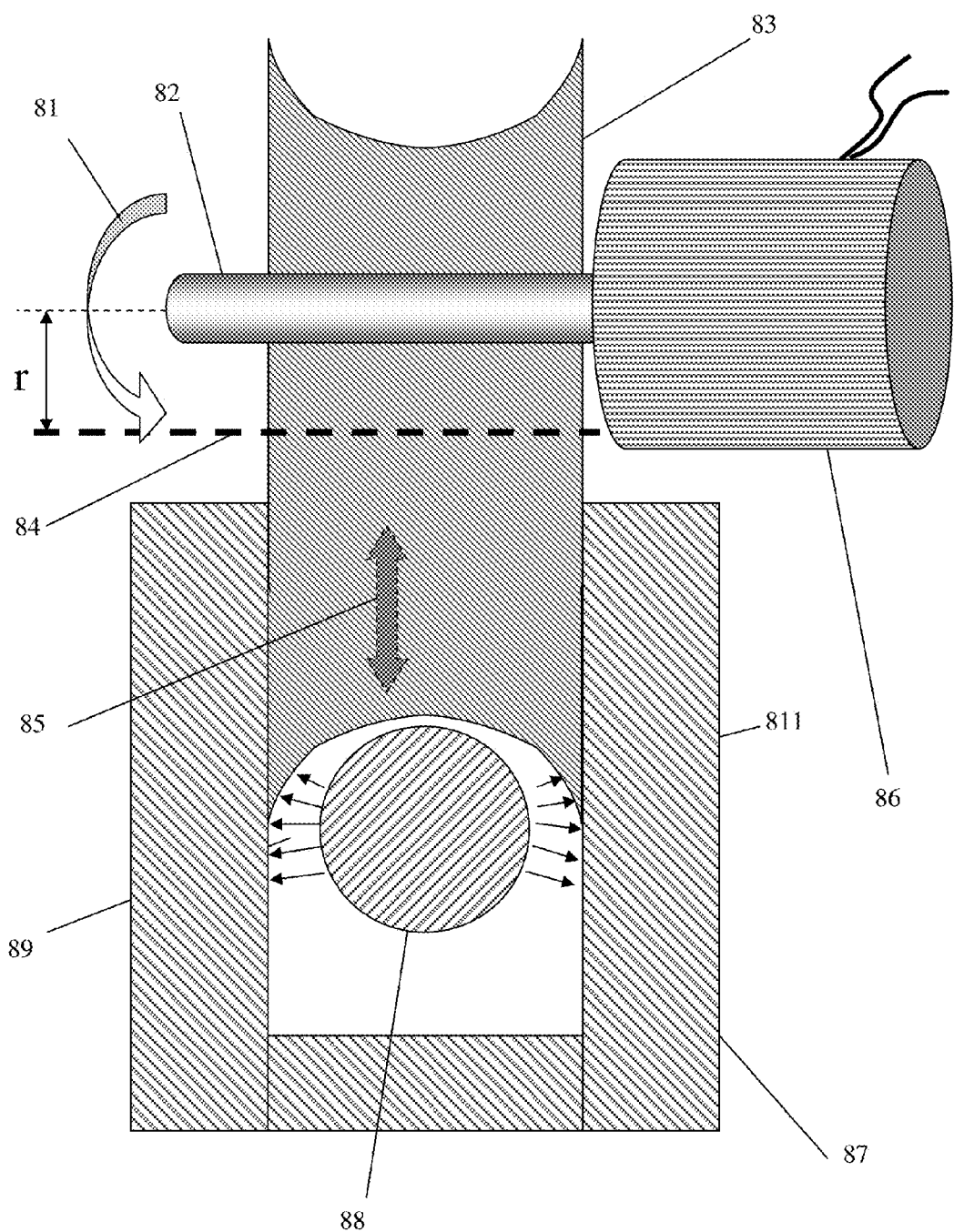
FIG. 8 depicts cross section of the eccentrically rotating RF probe approaching the center conductor of the slabline.

The mechanism of the disc probes is as follows (FIG. 6b): A disc-shaped metallic RF probe (67) has a cross section as shown in FIG. 8 (83); the disc is rotating around an axis (68) which is perpendicular to the axis of the slot (613) and the center conductor (612) of the slabline. The rotation axis (68, 73) is placed eccentrically relative to the center of the disc (75); this way, when the disc rotates the protrusion of the probe wings (811) around the center conductor (88) changes and the capture of the electric field (89) between the center conductor and the side-walls of the slabline changes; therefore also the reflection factor GAMMA changes; by consequence by simply rotating the disc-probe eccentrically we can control the amplitude of the reflection factor.

Figure 7:
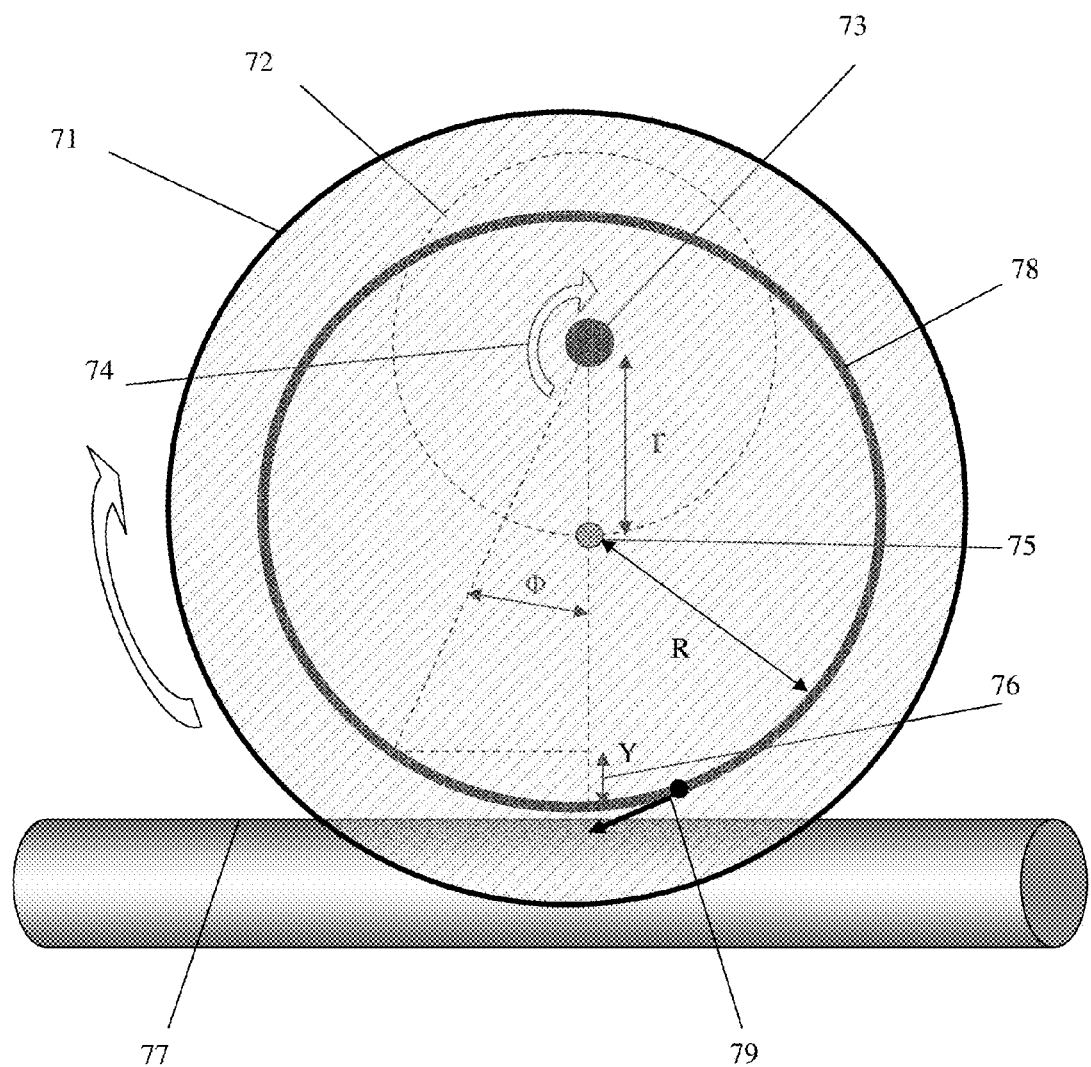
FIG. 7 depicts critical coordinates, mechanism and parameters of a rotating RF probe.

It is clear that, in the case of a circular disc, the center of the disc (84) must be different than the rotation axis (82). The eccentricity (r) defines the tuning resolution and the Max/Min ratio of the coupling of the disc-probe. If both axis overlap (r=0) then there is no GAMMA control; by varying the distance (r) one can create extremely high tuning resolution; on the other hand, in order to create acceptable residual GAMMA (corresponding to tuner initialization) the eccentricity (r) must be larger than a minimum size. It has been found that such typical size is of the order of 2 times the diameter of the center conductor. The rotation axis (73, 82) is attached to an electric stepper motor (86), which controls the rotation angle (Φ), (FIG. 7) and the distance Y between the bottom of said disc-probe and center conductor (77). The gap Y (76), between the bottom of the core of the disc-probe (78) and the top of the center conductor can be calculated from Y=(R+r)*(1−cos(Φ)) {2}, whereby R is the radius of the core of the disc-probe, r is the eccentricity and Φ is the angle relative to the vertical direction (FIG. 7). The tuning resolution TR at the closest point between probe and center conductor is then the inverse of: ∂Y/∂φ=(R+r)*sin(φ)≈(R+r)*φ {3}; or for φ≈0 the tuning resolution TR=∂Y/∂φ≈∞ {4}. Tuning resolution is important for tuner accuracy, since, at high tuning resolution (which in our case corresponds to maximum GAMMA) the effect of mechanical repeatability errors and motor step loss on tuning inaccuracy is strongly reduced.

By controlling <1> one can control GAMMA; if r=0 (the two axis are concentric) then Y=constant and GAMMA cannot be controlled. By choosing "r" one can control both the tuning resolution at high GAMMA and the tuning speed at low GAMMA. Additional benefit from a disc-probe is the progressive disturbance of the electric field, compared with prior art probes (FIG. 6). As can be seen the reflection of the injected electromagnetic wave is progressive (614) in a disc-probe, whereas it is abrupt in rectangular probes (63). In general abrupt disturbances create multiple reflections which lead to ripple in the response, of any wave propagation, including microwaves. As the probe (61) moves (62) closer to the center conductor (66) a portion of the travelling wave is reflected (63) and a portion is transmitted (65); in the case of the disc probe, as the wings (67) of the probe envelop the center conductor (612) progressively both in direction of the incoming (614) and the leaving (611) wave, this field disturbance (reflection) occurs progressively. This creates fewer ripples. Similar transformers (tapers) are common in physics in general (Megaphones) and in the microwave art, see ref. 4.

When an impedance synthesis (tuning) is requested by a user, the computer loads the calibration data from the harddisk into its active memory and scans through them to find the closest match between a calibrated impedance point and the requested impedance. After this first step a second search is performed, in which interpolated data between calibration points are used.

The calibration data by themselves do not suffice for accurate and detailed measurements. The tuner offers much higher resolution than typical 500 to 1,000 calibration points allow. The interpolation algorithm comprises two steps; given a target reflection factor (=impedance), in a first step a fast numeric search among all fixed calibration points allows to identify a grid of closest calibrated points to the target impedance (X1,φ1) to (X3,φ3) whereby the angle φi can also be expressed in motor steps (S) with φi=φ(Si); in a second step and using the probe's horizontal (X) and vertical (S) coordinates inside the slabline, a numerical, second order, interpolation algorithm is employed in order to calculate the s-parameters of the tuner two-port at any specific RF probe position with great accuracy; this is possible because the selected interpolation formulas describe accurately the natural behavior of the tuners, with its smooth and continuous dependence of s-parameters from horizontal and vertical positions of the RF probe.

The s-parameters of the tuner are calculated using the following interpolation formula:

$$Sij(X,S)=A(S)*Sij(Xk,S1)+B(S)*Sij(Xk,S2)+C*Sij(Xk,S3), \quad (1)$$

where k={1,2,3}. The coefficients A, B, C are calculated using the following relations:

$$A(X)=(X-X2)*(X-X3)/((X1-X2)*(X1-X3)); \quad (2)$$

$$B(X)=(X-X1)*(X-X3)/((X2-X1)*(X2-X3)); \quad (3)$$

$$C(X)=(X-X2)*(X-X1)/((X3-X2)*(X3-X1)); \quad (4)$$

$$A(S)=(S-S2)*(S-S3)/((S1-S2)*(S1-S3)); \quad (5)$$

$$B(S)=(S-S1)*(S-S3)/((S2-S1)*(S2-S3)); \quad (6)$$

$$C(S)=(S-S2)*(S-S1)/((S3-S2)*(S3-S1)), \quad (7)$$

where X and S correspond to the physical horizontal position of the probe and vertical distance between probe and center conductor inside the slabline. These formulas allow calculating the s-parameters of the tuner using 3 sets of 3 points (Xi,j-Si,j) with {i,j}={1,2,3}, surrounding the requested position X,S. The 3 sets of points are: set 1: (X1,S1), (X1,S2), (X1,S3); set 2: (X2,S1), (X2,S2), (X2,S3); set 3: (X3,S1), (X3,S2), (X3,S3) are the coordinates of the closest calibrated points to the target reflection factor. The choice is adequate because a horizontal only movement of the RF probe changes the phase and a rotation of the probe mostly changes the vertical distance to the center conductor and thus the amplitude of the reflection factor.

In this the angle of rotation φ is replaced by motor steps S, since motor steps correspond to rotor angles in a stepping motor. As an example a stepping motor with 200 steps/revolution will drive the probe from 0 to 90 degrees in 50 steps. If this resolution is insufficient a reducing gear using pulleys and belts of gear wheels is used. The interpolated s-parameters are used searching a final match between target and calculated impedance.

The final match is found usually very close or identical within approximately 1% or better, in reflection factor terms of the requested impedance value. The error is defined as |GAMMA.target-GAMMA.tuned|$^2$, whereby vector GAMMA=|GAMMA|*exp(j<GAMMA). To be noticed that the angle of the reflection factor is unrelated to the angle of rotation of the probe.

Figure 9:
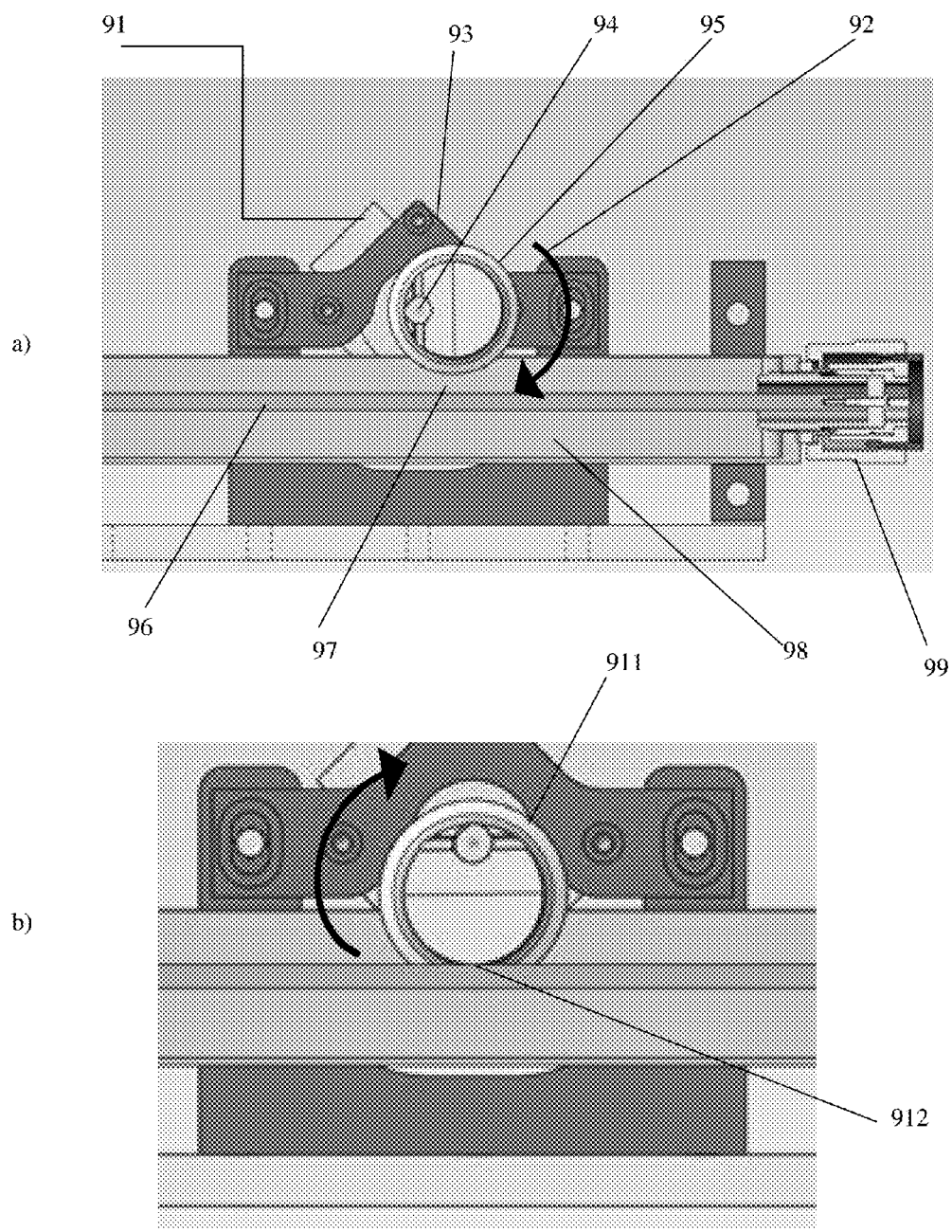
FIG. 9 depicts side view of rotating RF probe in two positions (states) relative to the center conductor: a) low coupling; b) maximum coupling.
Figure 10:
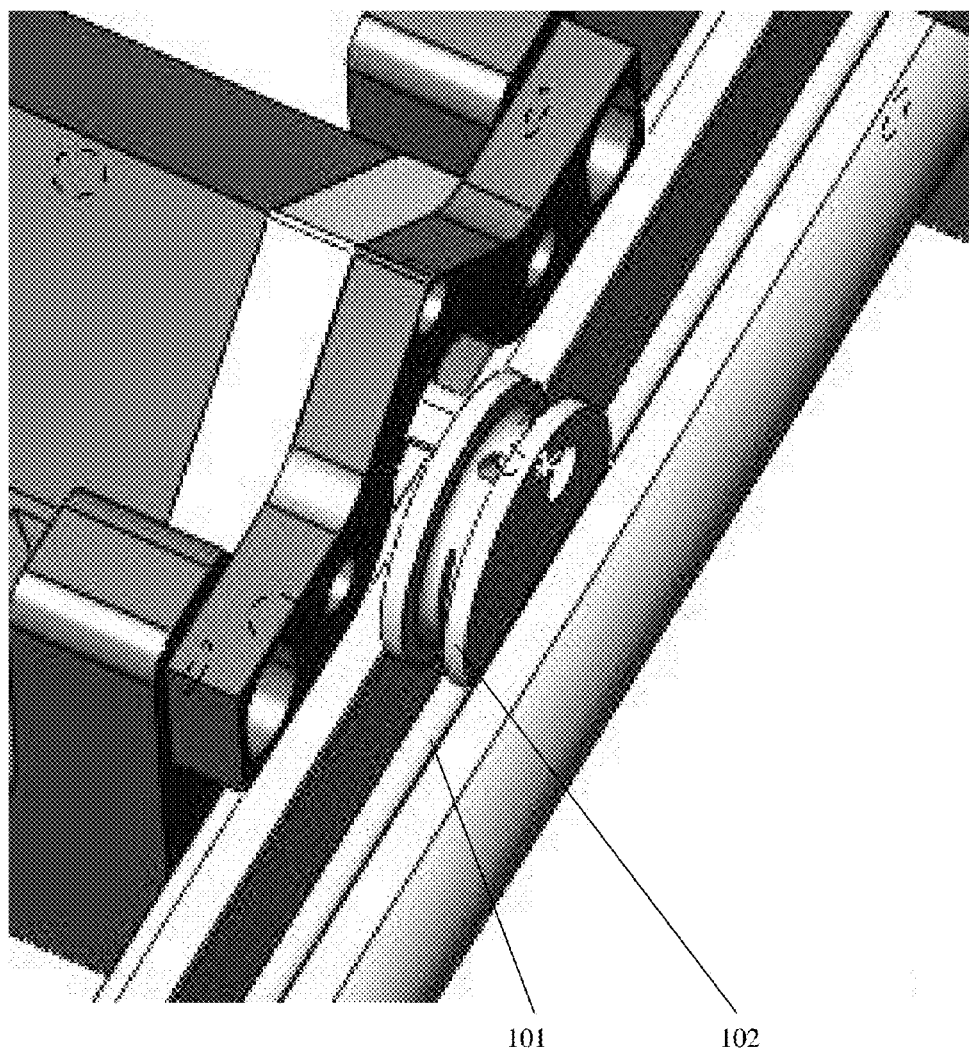
FIG. 10 depicts perspective view of rotating RF probe in a slabline.
Figure 11:
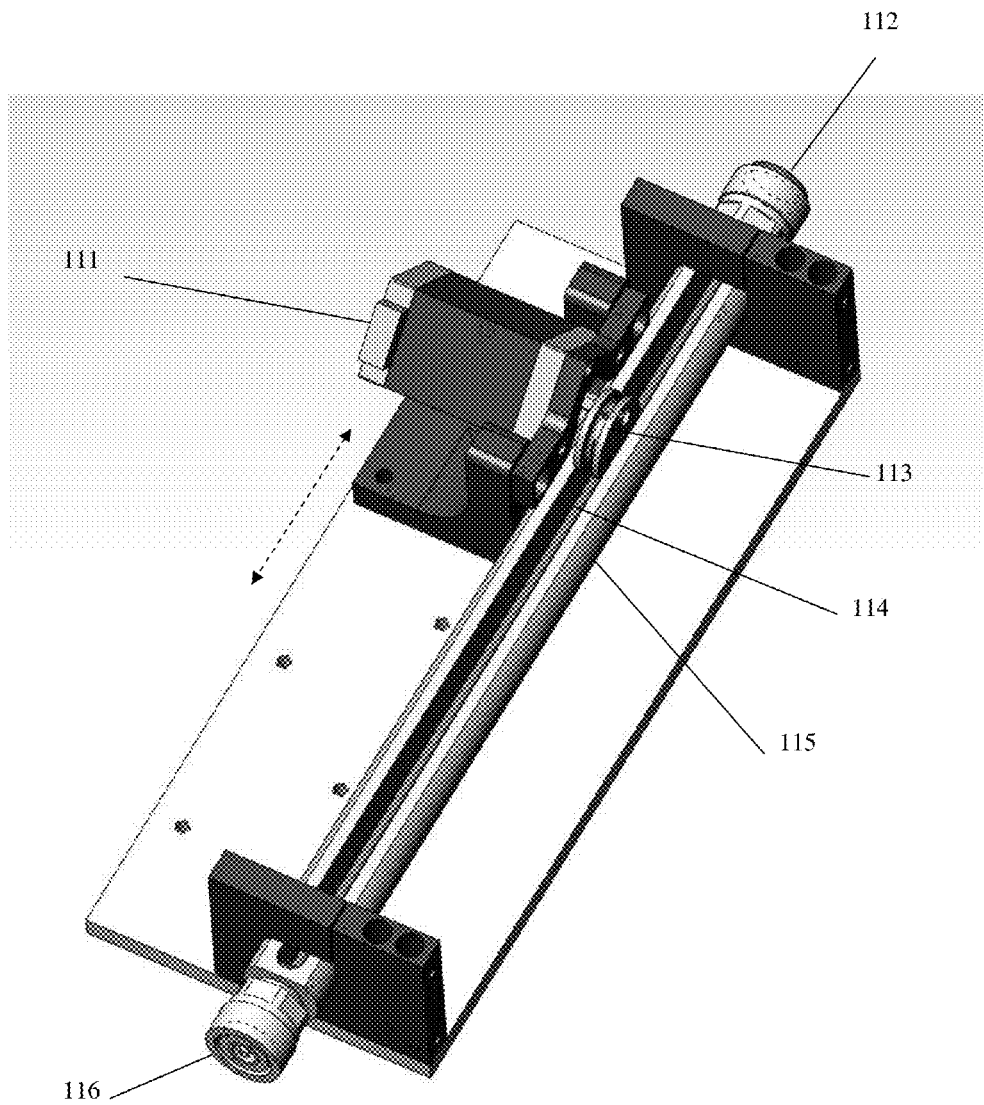
FIG. 11 depicts perspective view of rotating RF probe in a tuner assembly.

FIG. 9 shows a front view of a tuner core assembly with a disc-probe in two tuning positions: in FIG. 9(a) the probe (95) is decoupled from the center conductor (96) and GAMMA is low (or minimum, depending on the eccentricity value of the center of the disc to the rotation axis (94); item (99) is a slabline RF connector used as tuner test port and item (93) is the bracket holding the disc-probe and the stepper motor (91); by rotating the disc as shown by (92) the coupling and GAMMA increase. In FIG. 9(b) the disc-probe has maximum coupling and the gap to the center conductor is minimum (912). FIG. 10 offers a perspective view of the tuning area of the tuner, the disc-probe (102) and the center conductor (101); FIG. 11 shows the overall tuner (without horizontal carriage control), the input and output ports (112, 116), the slabline (115), the center conductor (114), the disc-probe (113) and the stepper motor (111).

Figure 5:
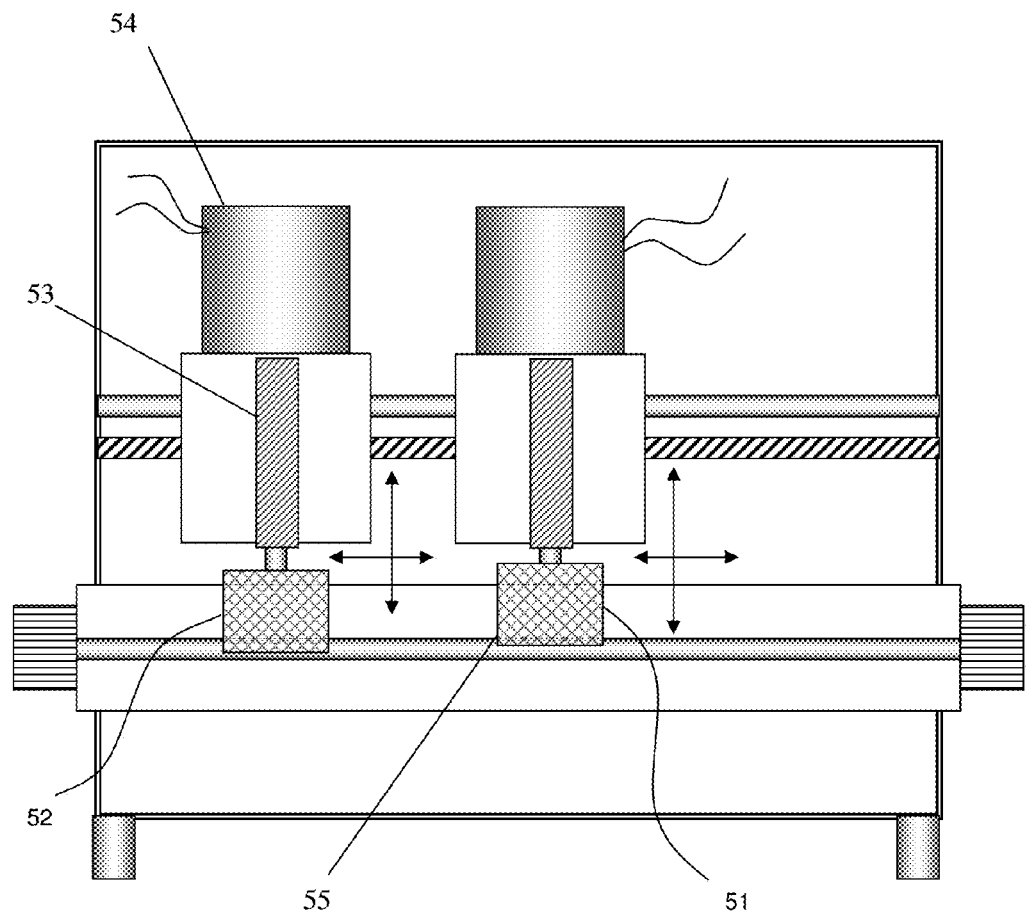
FIG. 5 depicts prior art: front view of a two independent carriage/two probe slide screw tuner.

A further advantage of the here disclosed disc-probes, compared with prior art block-probes, is the avoidance of edge effects and associated peak electric fields and corona arcing. The difference can be seen in FIGS. 5, 6(a) and 6(b): At the position (55) at the edge of the block-probe the voltage between center conductor and ground will cause an electric field, which is higher than the average field due to the RF power injected, and thus premature arcing (corona discharge); this is shown in FIG. 6(a) by arrow (63); in the case of a disc-probe (FIG. 6(b)) there are no edges creating peak electric fields: the transition from the center conductor to grounded probe is gradual (614). This lowers the electric field and thus the risk for arcing.

Figure 1:
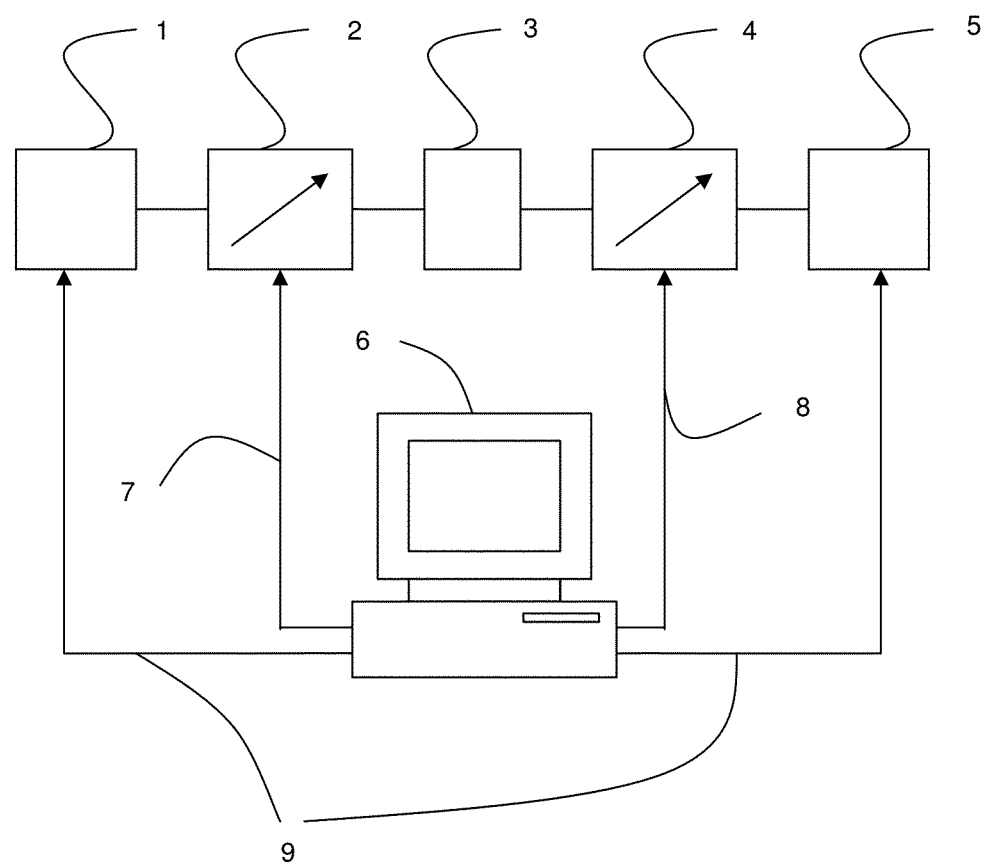
FIG. 1 depicts prior art, a typical automated transistor load pull test system.
Figure 2:
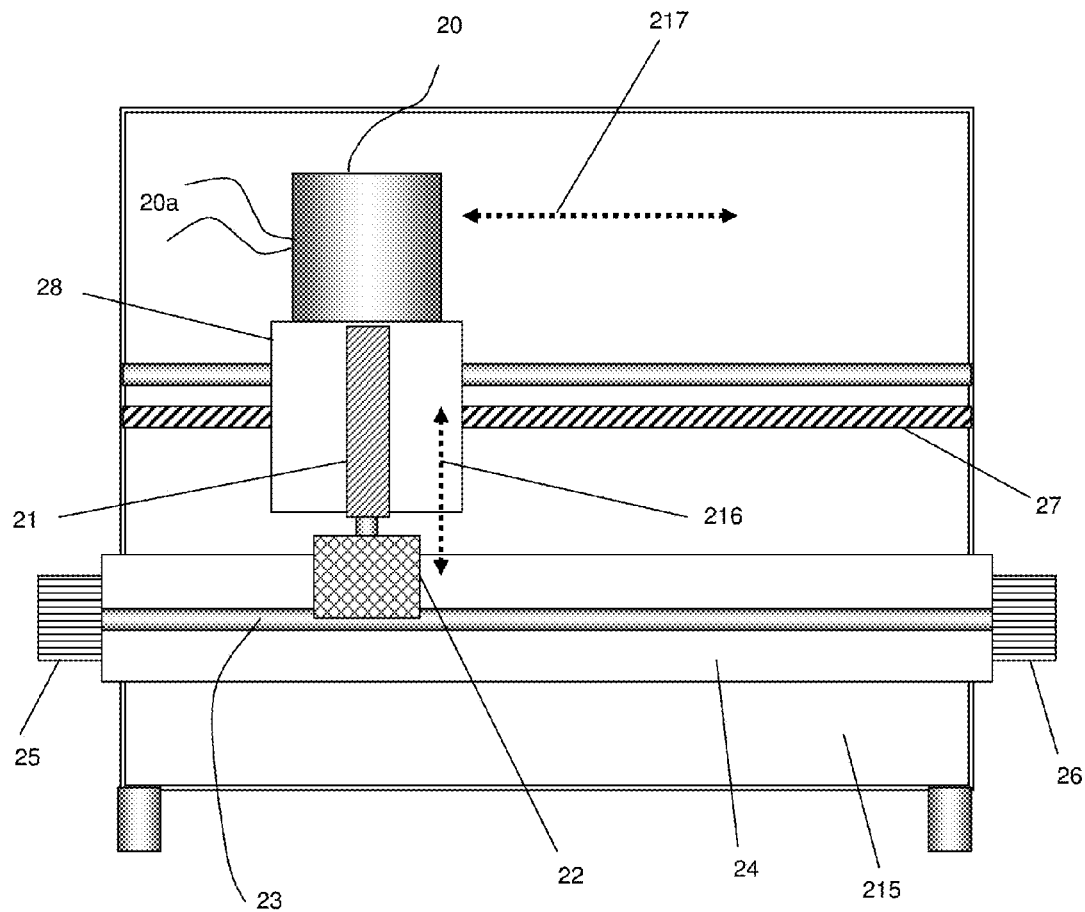
FIG. 2 depicts prior art, a front view of an automated slide screw impedance tuner using a single vertical axis and RF probe (slug).

The rotation of the bottom point of the disc-probe as it approaches the center conductor causes said point to travel horizontally (79). The disc-probe does not approach the center conductor at one point (FIG. 7); the increase of the capacitance, as the probe approaches the center conductor creates a negative phase turn of GAMMA on the Smith chart (see ref. 5, FIG. 1); this horizontal shift of the closest point, when viewed from the test port of the tuner (from the left in FIG. 7) will create a compensation of this phase shift which will also improve the interpolation accuracy of the algorithms used to calculate GAMMA between calibrated points, see ref. 5.

Figure 12:
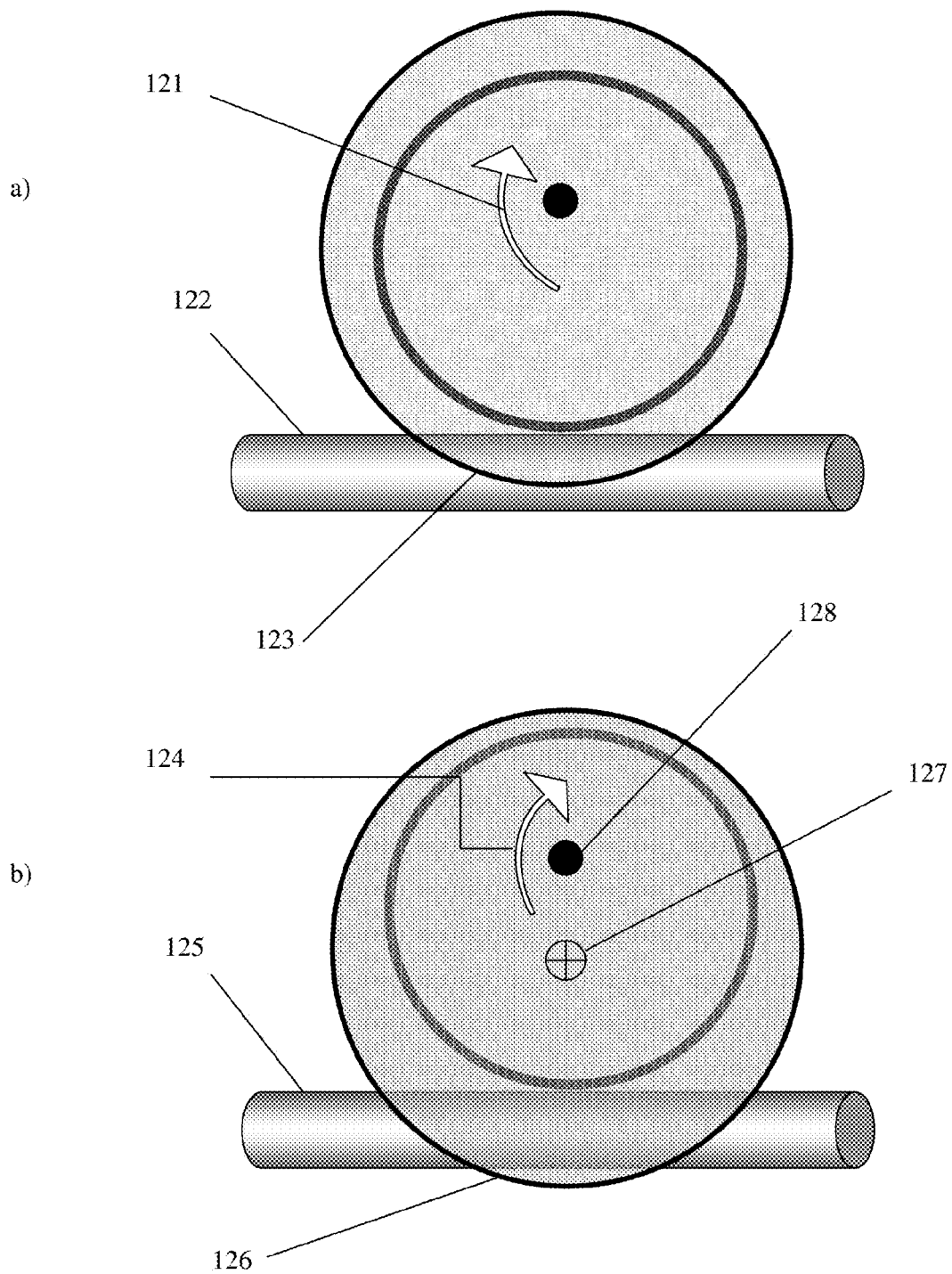
FIG. 12 depicts two versions of rotating RF probe: a) symmetrical probe; b) asymmetrical probe, allowing higher coupling with center conductor.
Figure 13:
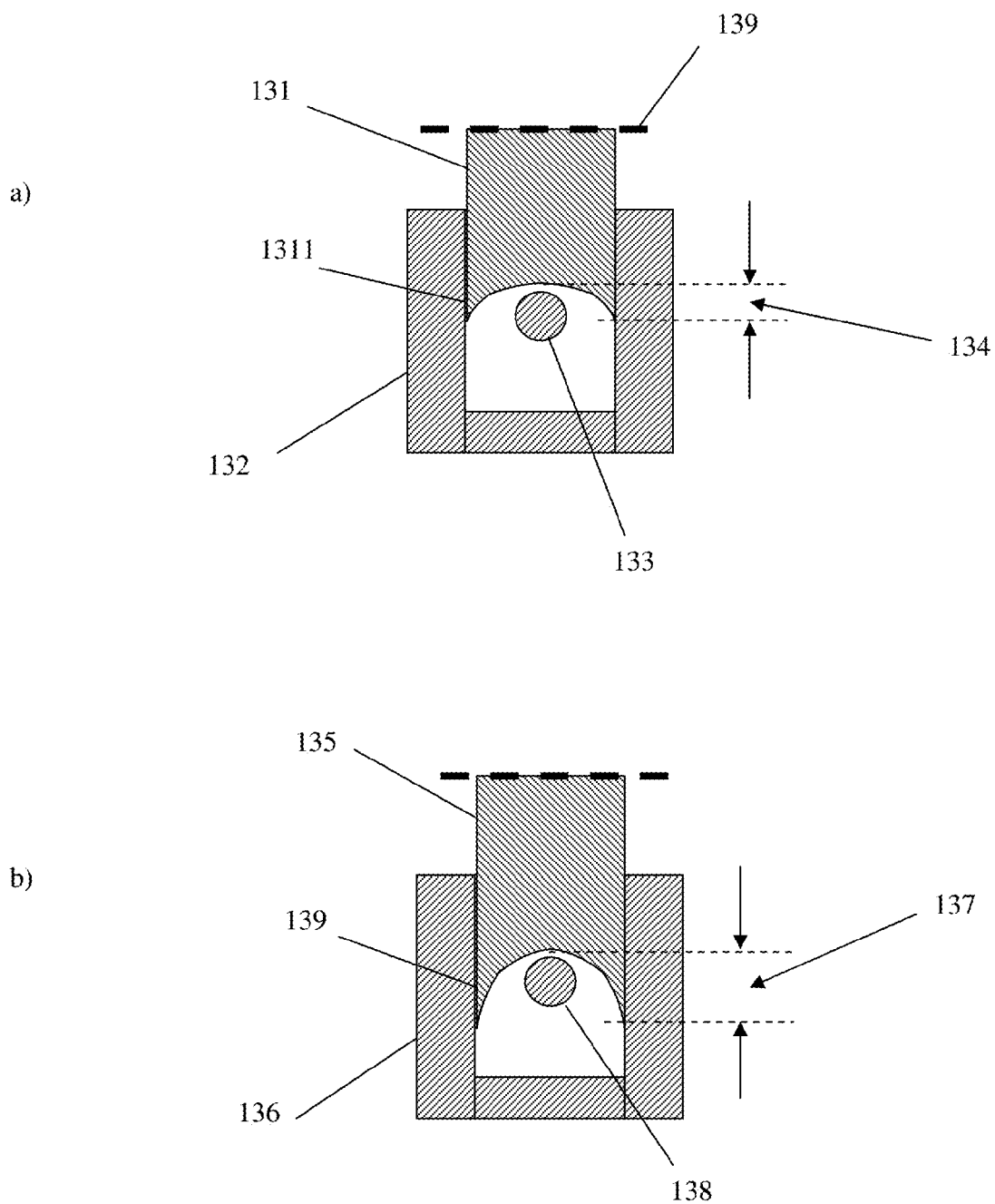
FIG. 13 depicts two versions of rotating RF probe: a) with short protruding legs (FIG. 12a); b) with long protruding legs (FIG. 12b).

An alternative disc-probe design is shown in FIG. 12: in the case of FIG. 12(b) the protruding wings of the probe (126) are longer than in the case of FIGS. 12(a) and 13(a), items (123, 134). The coupling is controlled by rotation due to the eccentricity, but in the case of FIG. 12(b) more electric field is captured (see also FIGS. 13(b) and 8).

Figure 16:
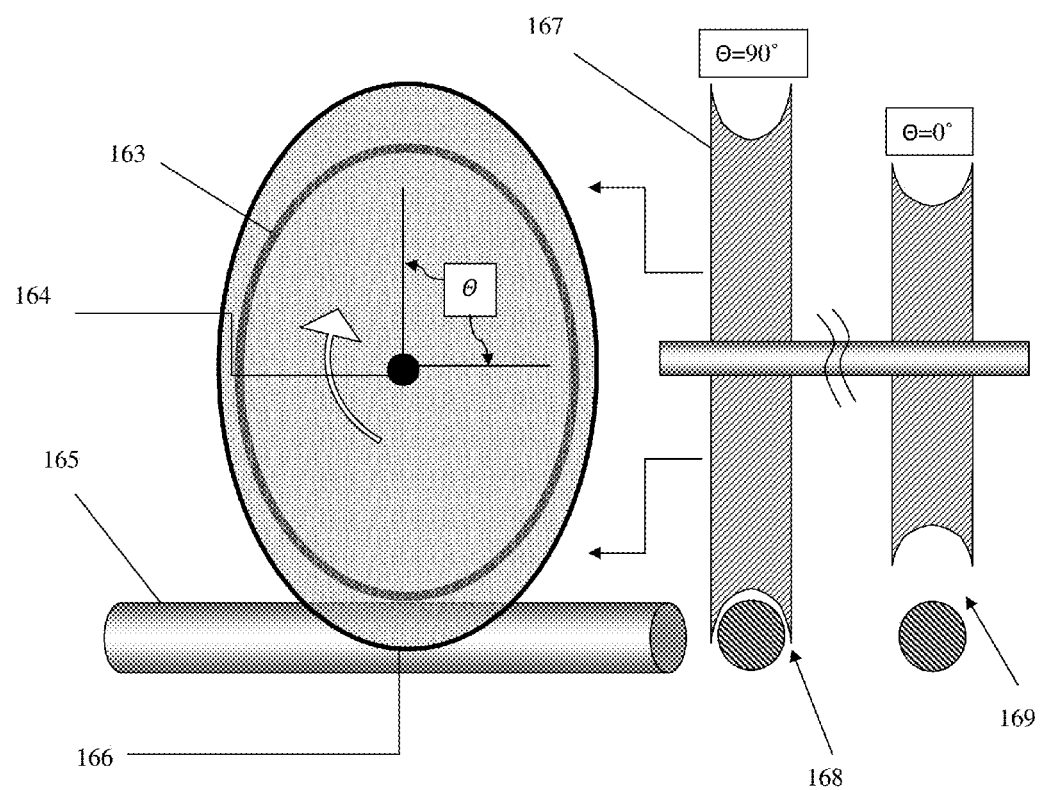
FIG. 16 depicts front and side views of a rotating probe with elliptic form.

The effect of changing the coupling between the probe (166) and the center conductor (165) of the slabline does not have to be based on an eccentric rotation axis. If the core of the disc-probe (163) has an elliptic form and rotates around the geometric center (164) as shown in FIG. 16, then the rotation will create the variable coupling (168), (169) and hence the adjustable reflection factor sought. If the angle Φ of rotation is 90 degrees we obtain a maximum coupling (168) and maximum reflection factor. If the angle is 0 degrees the coupling and reflection factor become nil. This configuration maintains all advantages of the eccentric rotation axis of FIG. 12 and is, in principle, equivalent.

The same effect can be reached if the disc-probe has an oval form. As long as there is a groove machined on the periphery and by rotating the probe we can reach various distances and overlapping between the probe wings and the center conductor of the slabline the reflection factor control will be made possible. There are several forms that allow this to happen; we only mentioned here the eccentrically rotating circular disc, the elliptic disc and the oval disc to show the globally valid concept, on which the invention relies.

Figure 14:
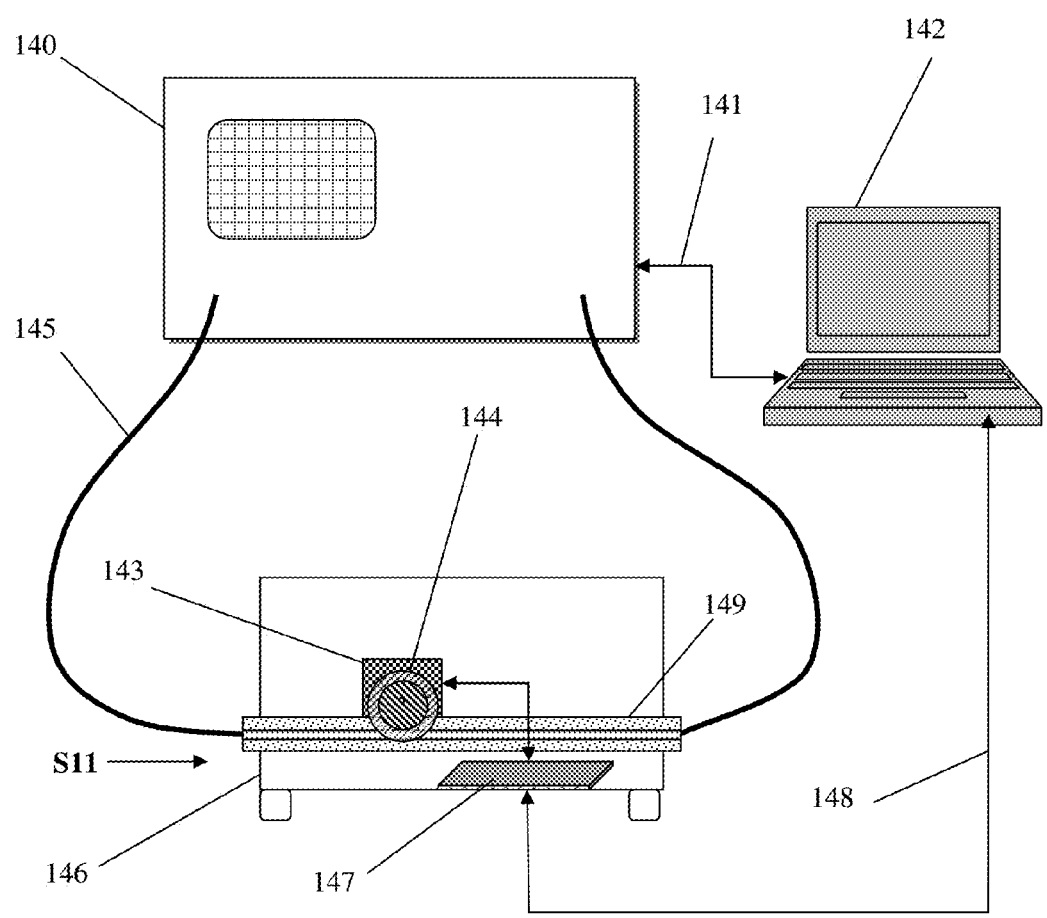
FIG. 14 depicts calibration setup of automated tuner using a VNA.

The tuner calibration process uses a setup as in FIG. 14: the stepper motor (143) is directed by the control computer (142) to rotate the disc probes into the slot of the slabline in order to increase the GAMMA value, while reading the four scattering parameters (S-parameters) from the VNA (140) using standard communication cable (141) and protocol. S-parameters of the tuner are measured at typically 10 to 20 angles of the disc-probe, corresponding to minimum and maximum GAMMA, and saved in a calibration file in the form Sij(φj, Xi); where "φj" is the relative angle of the probe rotation, starting with an initial position (zero), relative to the vertical direction (FIG. 7); and horizontal position X of each probe-carrying carriage between a starting (zero) position and one half of a wavelength at the selected frequency. This procedure is repeated for each disc-probe and each frequency of interest and the data are saved in successive calibration files for later use.

Obvious alternatives to the disclosed concept of rotating disc-shaped RF probes for slide screw tuners are possible but shall not impede on to the validity of the present invention.

What I claim as my invention is:
1. A slide screw microwave impedance tuner comprising
an input and an output port and a slotted airline between said ports, and a cylindrical center conductor running parallel to the slot of said airline between said input and output ports,
and at least one mobile carriage sliding parallel to the axis of said airline; and disc-shaped rotating conductive tuning probes;
said probes being mounted on said mobile carriage,
wherein the surface of said disc-probes is parallel to the airline slot; said probes being insertable vertically into the slot of said airline;
said rotation axis of said probes being perpendicular to the axis of said airline and attached to remotely controlled electrical stepper motors using appropriate gear.

2. A calibration method for electro-mechanical impedance tuner as in claim 1, connected to a pre-calibrated vector network analyzer (VNA), comprising the following steps:
   a) initialization step: whereby said tuner is initialized, i.e. said carriage is moved to an initial position and said disc-probe is rotated to an angle creating minimum coupling with the center conductor of said slabline;
   b) scaling step: whereby said disc-probe is rotated into the slot of said slabline, the reflection factor GAMMA is measured at the tuner test port and the rotation angles $\Phi i$ associated with GAMMA($\Phi i$) values between minimum and maximum in a number N>2 of levels are saved in memory;
   c) calibration step: whereby tuner four-port s-parameters are measured by and retrieved from the VNA for N angle probe positions at said rotation angles $\Phi i$ and horizontal probe positions between the initial horizontal position and a distance of at least one half of a wavelength at the selected frequency,
   and saved in tuner calibration file.

3. An impedance synthesis algorithm for tuners as in claim 1 comprising the following steps:
   a) user definition of the GAMMA-target;
   b) search algorithm, in computer memory, through the calibration data for identifying the calibrated S 11.c value closest to GAMMA-target, for which the vector difference is minimum;
   c) alternative horizontal and angle search algorithm of interpolated points, in computer memory, in the vicinity of the calibrated point S 11.c for S 11 values closer to GAMMA-target;
   d) determine the horizontal position Xo of the probe and the angle φo of the disc-probe corresponding to the closest found calibrated or interpolated point to GAMMA-target;
   e) move the mobile carriage to the horizontal position Xo and rotate the probe to the angle φo, found in step d).

4. Disc-probes for tuners as in claim 1, having a thickness matching the width of the slot of said airline;
   and a concave groove machined on the disc periphery, parallel to the disc surface, whereby the radius of said groove matches approximately the radius of the center conductor of said slabline;
   and wherein the rotation axis of said disc-probes is perpendicular to the center conductor of said slabline.

5. Disc-probes as in claim 4 having a circular form and a rotation axis different than the geometric center of said disc-probes.

6. Disc-probes as in claim 4 having elliptic form and a rotation axis close to the geometrical center of said disc-probes.

7. Disc-probes as in claim 4 having oval form and a rotation axis close to the geometrical center of said disc-probes.

8. Disc-probes as in claim 4, whereby the concave surface of said groove is dielectrically coated.

9. Disc-probes as in claim 4, having a narrow slot parallel to the disc surface and centered along the said groove.

10. Disc-probes as in claim 4, having long over-hanging sidewalls of the concave groove (126) reaching beyond the diameter of said center conductor.

11. Disc-probes as in claim 4, having longer over-hanging sidewalls (126) of the concave groove towards the geometrical center (127) of said disc than in direction of the rotation axis (128).

12. A method for generating adjustable reflection factor in slotted microwave airlines; said airlines having an input and an output port,
   and conductive parallel plate sidewalls forming a channel,
   and a cylindrical center conductor between said ports running along the said channel;
   said method comprises two steps:
   a) insert into the channel a conductive disc having a concave groove on its periphery and making RF contact with the channel sidewalls,
      whereby the surface of said disc is parallel to the sidewalls of said airline, and whereby the radius of said groove matches approximately the radius of said center conductor;
   b) approach the concave groove on the periphery of said disc to the center conductor.

13. A method as in claim 12, whereby said disc is rotated eccentrically to allow controlling the distance between the center conductor of said airline and the peripheral groove of said disc.

14. A method as in claim 12, whereby said disc is elliptic.

15. A method as in claim 14, whereby said disc rotates around a center close to its geometrical center to allow controlling the distance between the center conductor of said airline and the peripheral groove of said disc.

\* \* \* \* \*